United States Patent [19]

Terashima

[11] Patent Number: 5,155,569
[45] Date of Patent: Oct. 13, 1992

[54] THYRISTOR DEVICE WITH IMPROVED TURN-OFF CHARACTERISTICS

[75] Inventor: Tomohide Terashima, Fukuoka, Japan

[73] Assignee: Mitsubishi Denki Kabushiki Kaisha, Tokyo, Japan

[21] Appl. No.: 735,886

[22] Filed: Jul. 25, 1991

[30] Foreign Application Priority Data

Aug. 18, 1990 [JP] Japan .................. 2-217605

[51] Int. Cl.⁵ .................. H01L 29/74; H01L 29/747; H01L 29/00
[52] U.S. Cl. ...................... 357/38; 357/39; 357/37
[58] Field of Search .............. 357/38, 38 T, 23.12, 357/23.4, 39, 37

[56] References Cited

U.S. PATENT DOCUMENTS 4.857.983  8/1989  Baliga et al. .................. 357/38
4.967.244  10/1990  Bauer .......................... 357/38

OTHER PUBLICATIONS

"MOS-Controlled Thyristors—A New Class of Power Devices", IEEE Transactions on Electron Devices, vol. ED-33, pp. 1609–1618, 1986.
"The MOS Depletion-Mode Thyristor: A New MOS--Controlled Bipolar Power Device", IEEE Electron Device Letters vol. 9, 1988.

Primary Examiner—William Mintel
Assistant Examiner—Wael Fahmy
Attorney, Agent, or Firm—Oblon, Spivak, McClelland, Maier & Neustadt

[57] ABSTRACT

A thyristor structure comprises a p⁺-type substrate (21), an n-type base layer (22), a first p-type diffusion region (23) and an n⁺-type diffusion region (25). A MOS structure comprises the base layer (22), first and second p-type diffusion regions (23, 24) and the n⁺-type diffusion region (25). A positive voltage is applied to a gate electrode (27) to form a channel in a portion of the first diffusion region (23) just under the gate electrode (27), so that a cathode electrode (28) supplies carriers to the base layer (22) through the n⁺-type diffusion region (25) and the channel, to turn on the thyristor. A negative voltage is applied to the gate electrode (27) to form a channel in a portion of the base layer (22) just under the gate electrode (27), so that the first p-type diffusion region (23) and the n⁺-type diffusion region (25) are shorted through the channel, the second p-type diffusion region (24) and the cathode electrode (28), to turn off the thyristor.

8 Claims, 9 Drawing Sheets

THYRISTOR DEVICE WITH IMPROVED TURN-OFF CHARACTERISTICS

BACKGROUND OF THE INVENTION

1. Field of the Invention

The present invention relates to a thyristor and a method of manufacturing the same, and more particularly, it relates to an improvement in an MCT (MOS controlled thyristor).

2. Description of the Background Art

FIG. 11 is a sectional view showing a conventional MCT. Referring to FIG. 11, an n-type epitaxial layer 2a is formed on a p+-type semiconductor substrate 1, and an n--type epitaxial layer 2b is formed on the n-type epitaxial layer 2a. The n-type epitaxial layer 2a and the n--type epitaxial layer 2b define an n-type base layer 2. A p-type well region 3 is formed on the surface of the n-type base layer 2, by selectively diffusing a p-type impurity. An n+-type diffusion region 4 is formed on a central portion of the surface of the p-type well region 3 by selectively diffusing an n-type impurity of high concentration, while an n-type diffusion region 5 is formed adjacently to the n+-type diffusion region 4 by selectively diffusing an n-type impurity into an outer peripheral portion of the n+-type diffusion region 4. A p+-type diffusion region 6 is formed over the n+-type diffusion region 4 and the n-type diffusion region 5 by selectively diffusing a p-type impurity of high concentration into a region around the boundary between the surfaces of the regions 4 and 5. A gate insulating film 7 of an oxide is formed on the surfaces of the p-type well region 3 and the n-type diffusion region 5 which are held between the surfaces of the n-type base layer 2 and the p+-type diffusion region 6, and a gate electrode 8 of polysilicon is formed on the gate insulating film 7. A cathode electrode 9 of a metal is provided in contact with the surfaces of the n+-type diffusion region 4 and the p--type diffusion region 6. This cathode electrode 9 is isolated from the gate electrode 8 through an interlayer isolation film 10. On the other hand, an anode electrode 11 of a metal is formed on the back surface of the p+-type semiconductor substrate 1.

FIG. 12 is a circuit diagram showing an equivalent circuit of the MCT shown in FIG. 11. The n-type base layer 2, the p-type well region 3 and the n+-type diffusion region 4 serve as a collector, base and an emitter respectively to define an npn transistor Q1, while the p+-type semiconductor substrate 1, the n-type base layer 2 and the p-type well region 3 serve as an emitter, base and a collector respectively to define a pnp transistor Q2. Further, the n-type diffusion region 5 and the n--type epitaxial layer 2b serve as a source and a drain respectively and a surface part of the p-type well region 3 located just under the gate electrode 8 serves as a channel region to define an NMOS transistor Q3, while the p-type well region 3 and the p+-type diffusion region 6 serve as a source and a drain respectively and a surface part of the n-type diffusion region 5 located just under the gate electrode 8 serves as a channel region to define a PMOS transistor Q4.

The operation is now described. In order to turn on the MCT shown in FIG. 11, the NMOS transistor Q3 is turned on for a prescribed time in such a state that the anode electrode 11 is at a higher potential than the cathode electrode 9. When a positive voltage is applied to the gate electrode 8, the NMOS transistor Q3 is turned on so that electrons are injected into the base of the pnp transistor Q2 through the channel formed in the vicinity of the surface part of the p-type well region 3 located just under the gate electrode 8. Then, the pnp transistor Q2 is turned on and a large quantity of holes flow toward its collector by the amplifying action of the transistor. These holes are supplied to the base of the npn transistor Q1, which is then turned on so that a large quantity of electrons flow toward its collector by the amplifying action of the transistor. These electrons are supplied to the base of the pnp transistor Q2, to further strongly turn on the pnp transistor Q2. Thus, once the transistor Q2 is turned on, a positive feedback loop is defined between the transistors Q1 and Q2, whereby a thyristor formed by the transistors Q1 and Q2 is latched. Therefore, a current continuously flows between the anode electrode 11 and the cathode electrode 9 even if the NMOS transistor Q3 is turned off.

In order to turn off the MCT, on the other hand, the PMOS transistor Q4 is turned on for a prescribed time. When a negative voltage is applied to the gate electrode 8, the PMOS transistor Q4 is turned on so that holes to be injected into the base of the npn transistor Q1 are extracted by the cathode electrode 9 through the p+-type diffusion region 6 through a channel formed in the vicinity of a surface part of the n-type diffusion region 5 located just under the gate electrode 8. Consequently, the npn transistor Q1 is turned off and hence the pnp transistor Q2 is also turned off, to release the thyristor from latching. Thus, the main current having flown between the anode electrode 11 and the cathode electrode 9 is cut off.

As hereinabove described, the MCT is turned on when a positive voltage is applied to the gate electrode 8, which is common to the MOS transistors Q3 and Q4, for a prescribed time, while the same is turned off when a negative voltage is applied to the gate electrode 8 for a prescribed time.

The aforementioned operation is enciphered as follows: Assuming that $\alpha_1$ and $\alpha_2$ represent current amplification factors of the bipolar transistors Q1 and Q2, $I_{CO1}$ and $I_{CO2}$ represent collector saturation currents and $I_{g1}$ and $I_{g2}$ represent ON-state currents of the MOS transistors Q3 and Q4, an anode current $I_A$ is expressed as follows:

$$I_A = \frac{(1 - \alpha_1)I_{g1} - \alpha_1 I_{g2} + I_{CO1} + I_{CO2}}{1 - \alpha_1 - \alpha_2} \quad (1)$$

In turn-on operation, the current $I_{g1}$ flows in the state of the current $I_{g2}=0$ as hereinabove described, whereby a base current $I_{B2}$ of the transistor Q2 starts to flow and the transistor Q2 starts its operation. A collector current caused by the operation of the transistor Q2 is supplied as a base current $I_{B1}$ of the transistor Q1, and the current flowing in the transistors Q1 and Q2 is increased. In general, the current amplification factors $\alpha_1$ and $\alpha_2$ are increased with increase of the current, whereby the anode current $I_A$ is acceleratively increased. The MCT enters an ON state in the following state:

$$\alpha_1 + \alpha_2 = 1 \quad (2)$$

In turn-off operation, on the other hand, the current $I_{g2}$ flows in the state of the current $I_{g1}=0$, as hereinabove described. It is assumed here that $R_1$ represents a resistance component at the channel of the p-type well region 3 or the PMOS transistor Q4 with respect to the current $I_{g2}$. Due to the flow of the current $I_{g2}$, the current having flown into the transistor Q1 is reduced by an amount corresponding to the current $I_{g2}$, and the value $\alpha_{1+\alpha 2}$ is also reduced. A voltage drop $I_{g2}R_1$ at the resistance component $R_1$ is supplied as a base-toemitter forward bias voltage of the transistor Q1. However, the current amplification factor $\alpha_1$ of the transistor Q1 is abruptly reduced because this voltage is generally smaller so that electrons can not be injected into the base from the emitter of the transistor Q1. Consequently, the value $\alpha_{1+\alpha 2}$ is also acceleratively reduced, so that the MCT is turned off when $\alpha_{1+\alpha 2} < 1$.

In the conventional MCT having the aforementioned structure, triple diffusion is required in order to form the structure of the p-type well region 3, the $n^+$-type and n-type diffusion regions 4 and 5, and the $p^+$-type diffusion region 6. Thus, the manufacturing steps are complicated. Further, since the characteristics of the MOS transistors Q3 and Q4 depend on degrees of impurity concentration in respective diffusion steps in the triple diffusion, it is difficult to independently set ON-state resistances and threshold voltages (i.e., turn-on and turn-off conditions) of the MOS transistors Q3 and Q4. In addition, the cathode electrode 9 must be in contact with the $n^+$-type diffusion region 4 and the $p^+$-type diffusion region 6, and hence the p-type well region 3 enclosing the same is inevitably increased in width to increase the resistance component $R_1$. Since the current $I_{g2}$ is in positive correlation with a cathode current $I_k$, the voltage drop $I_{g2}R_1$ at the resistance component $R_1$ unpreferably reaches the voltage sufficient to inject electrons from the emitter to the base of the transistor Q1 and thus $\alpha_{1+\alpha 2} > 1$ if the current $I_{g2}$ is fed with conduction of the MOS transistor Q4 in order to turn off the MCT in a high state of the cathode current $I_k$, and hence the MCT cannot be turned off even if the MOS transistor Q4 is turned on.

SUMMARY OF THE INVENTION

According to the present invention, a thyristor comprises a first conductivity type first semiconductor layer having first and second major surfaces, a second conductivity type second semiconductor layer formed on the first major surface of the first semiconductor layer, first conductivity type first and second semiconductor regions selectively formed in a surface of the second semiconductor layer in a spaced-apart manner, a second conductivity type third semiconductor region selectively formed in a surface of the first semiconductor region, a first insulating film formed on a surface part of the first semiconductor region held between surfaces of the second semiconductor layer and the third semiconductor region, a second insulating film formed on a surface part of the second semiconductor layer held between surfaces of the first and second semiconductor regions, a first control electrode formed on the first insulating film, a second control electrode formed on the second insulating film, a first main electrode formed in contact with the second and third semiconductor regions, and a second main electrode formed on the second major surface of the first semiconductor layer.

Preferably the first and second insulating films are combined into a common insulating film, and the first and second control electrodes are combined into a common control electrode.

On the other hand, a method of manufacturing a thyristor according to the present invention comprises the steps of (a) preparing a first conductivity type first semiconductor layer having first and second major surfaces, (b) forming a second conductivity type second semiconductor layer on the first major surface of the first semiconductor layer, (c) selectively forming first conductivity type first and second semiconductor regions in a surface of the second semiconductor layer in a spaced-apart manner, (d) selectively forming a second conductivity type third semiconductor region in a surface of the first semiconductor region, (e) forming an insulating film on surface parts of the second semiconductor layer and the first semiconductor region held between surfaces of the second and third semiconductor regions, (f) forming a control electrode on the insulating film, (g) forming a first main electrode which is in contact with the second and third semiconductor regions, and (h) forming a second main electrode on the second major surface of the first semiconductor layer.

Preferably the steps (c) and (d) are carried out after the steps (e) and (f), and the step (c) includes a step of forming the first and second semiconductor regions by self alignment using the control electrode formed in the step (f) as a mask, while the step (d) includes a step of forming the third semiconductor region by self alignment using the control electrode formed in the step (f) as a mask.

The thyristor according to the present invention is defined by the first and second semiconductor layers and the first and third semiconductor regions. A prescribed voltage is applied to the first control electrode to define a channel in a surface part of the first semiconductor region located just under the same, so that the first main electrode supplies carriers to the second semiconductor layer through the third semiconductor region and the channel, to turn on the thyristor. On the other hand, a prescribed voltage is applied to the second control electrode to define a channel in a surface part of the second semiconductor layer located just under the same, so that the first and third semiconductor regions are shorted through the channel, the second semiconductor region and the first main electrode, to turn off the thyristor.

According to the inventive method of manufacturing a thyristor, the first and second semiconductor regions are formed in a spaced-apart manner and the third semiconductor region is formed on the surface of the first semiconductor region, whereby manufacturing steps may be carried out not for triple diffusion but for double diffusion. Further, the manufacturing steps are not complicated since first and second control electrodes are combined into a common control electrode.

Consequently, it is possible to obtain a thyristor, which can be manufactured through simple steps to be capable of independently setting turn-on and turn-off conductions with high maximum main current density capable of turn-off operation, and a method of manufacturing the same.

Accordingly, an object of the present invention is to obtain a thyristor, which can be manufactured through simple steps to be capable of independently setting turn-on and turn-off conditions with high maximum main current density capable of turn-off operation, and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
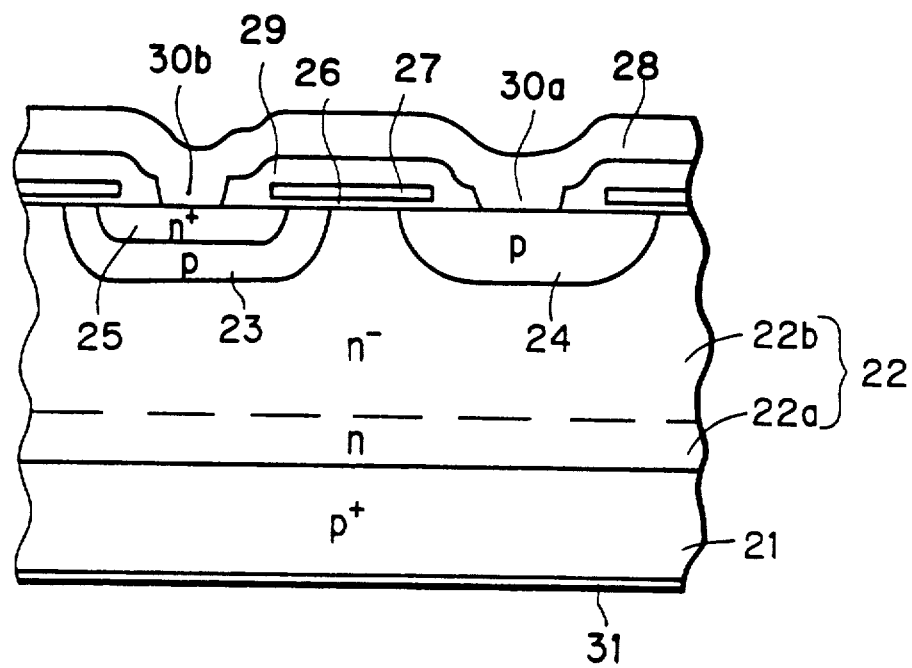
FIG. 1 is a sectional view showing an embodiment of a thyristor according to the present invention.

FIG. 1 is a sectional view showing a preferred embodiment of a thyristor according to the present invention. Referring to FIG. 1 an n-type epitaxial layer $22a$ is formed on a $p^+$-type semiconductor substrate 21 of silicon, and an $n^-$-type epitaxial layer $22b$ is formed on the n-type epitaxial layer $22a$. The n-type epitaxial layer $22a$ and the $n^-$-type epitaxial layer $22b$ define an n-type base layer 22. First and second p-type diffusion regions 23 and 24 are selectively formed on the surface of the n-type base layer 22 in a spaced-apart manner, and an $n^+$-type diffusion region 25 is selectively formed on a central surface part of the first p-type diffusion region 23. A gate insulating film 26 of an oxide is formed on surface parts of the $n^-$-type epitaxial layer $22b$ and the first p-type diffusion region 23 held between the surfaces of the second p-type diffusion region 24 and the $n^+$-type diffusion region 25, and a gate electrode 27 of polysilicon is formed on the gate insulating film 26. A cathode electrode 28 of a metal is provided to be in contact with the surfaces of the second p-type diffusion region 24 and the $n^+$-type diffusion region 25 respectively through contact holes $30a$ and $30b$, which are formed in an interlayer isolation film 29. This cathode electrode 28 is isolated from the gate electrode 27 through the interlayer isolation film 29. On the other hand, an anode electrode 31 of a metal is formed on the back surface of the $p^+$-type semiconductor substrate 21.

Figure 2:
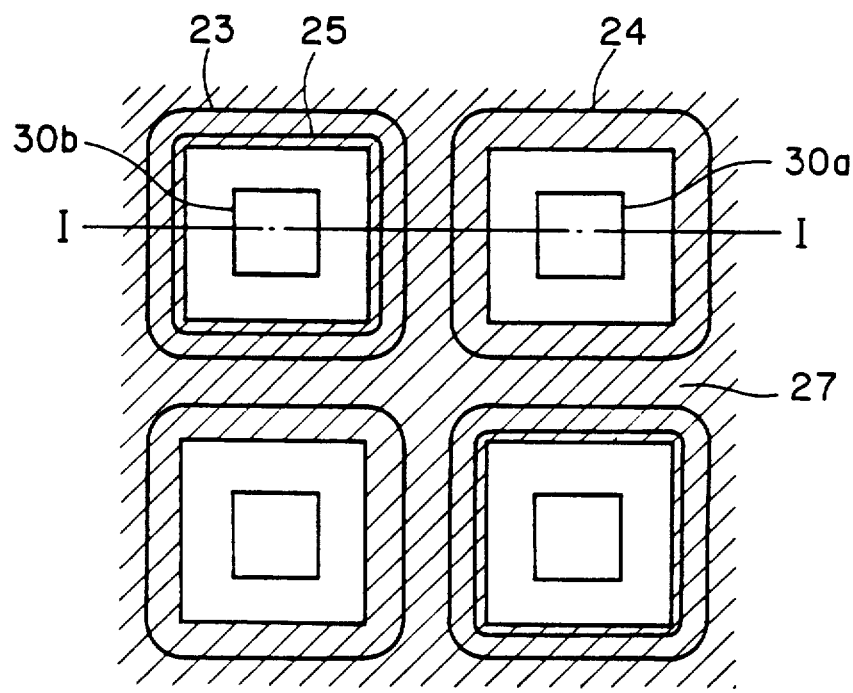
FIGS. 2 and 3 are plan views showing exemplary plane patterns for the structure shown in FIG. 1.
Figure 3:
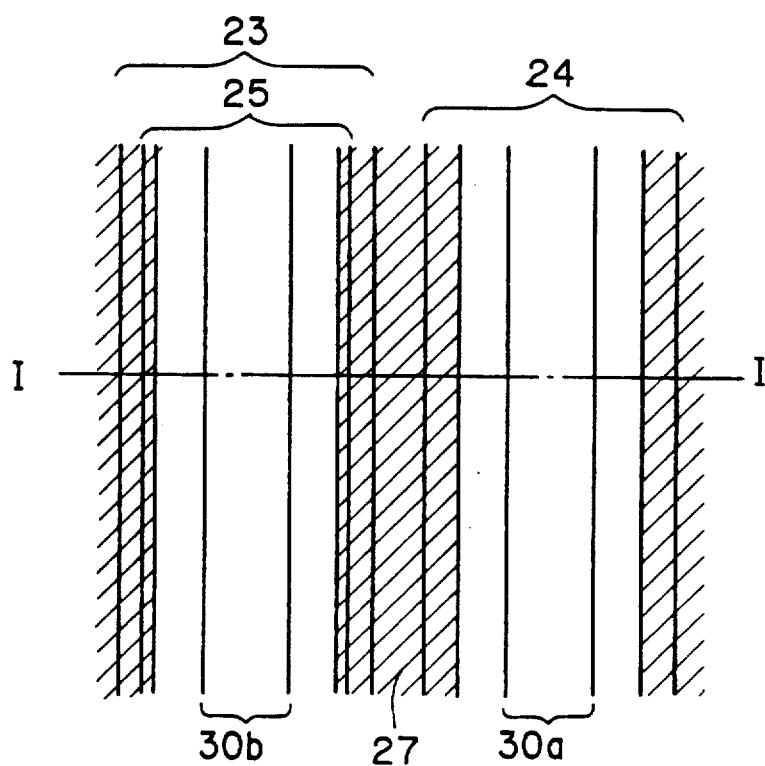

FIGS. 2 and 3 illustrate exemplary plane pattern for the structure shown in FIG. 1. In the plane pattern shown in FIG. 2, the first and second p-type diffusion regions 23 and 24 and the $n^+$-type diffusion region 25 are in the form of square islands. In the plane pattern shown in FIG. 3, on the other hand, the first and second p-type diffusion regions 23 and 24 and the $n^+$-type diffusion region 25 are in the form of stripes. FIG. 1 shows a section taken along the line I—I in FIG. 2 or 3.

Figure 4:
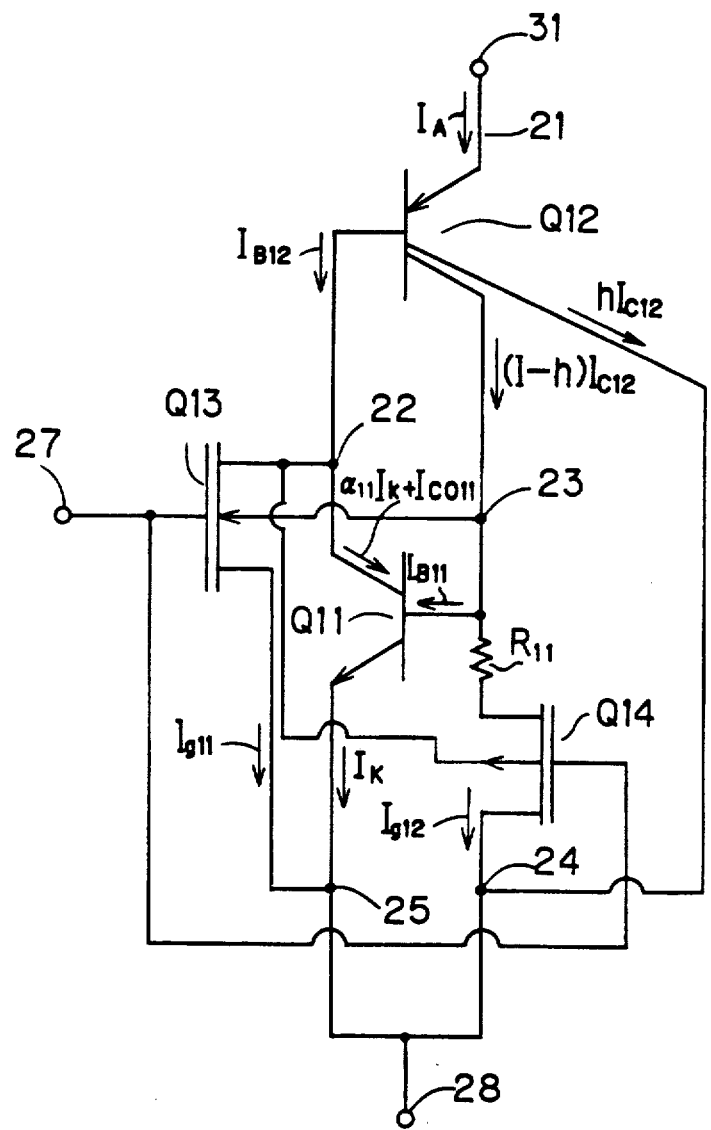
FIG. 4 is a current diagram showing an equivalent circuit of the structure shown in FIG. 1.

FIG. 4 is a circuit diagram showing an equivalent circuit of the thyristor shown in FIG. 1. The n-type base layer 22, the first p-type diffusion region 23 and the $n^+$-type diffusion region 25 serve as a collector, a base and an emitter respectively to define an npn transistor Q11, while the $p^+$-type semiconductor substrate 21, the n-type base layer 22 and the first p-type diffusion region 23 serve as an emitter, a base and a collector respectively to define a pnp transistor Q12. Further, the $n^+$-type diffusion region 25 and the $n^-$-type epitaxial layer $22b$ serve as a source and a drain respectively and a surface part of the first p-type diffusion region 23 located just under the gate electrode 27 serves as a channel region to define an NMOS transistor Q13, while the first p-type diffusion region 23 and the second p-type diffusion region 24 serve as a source and a drain respectively and a surface part of the $n^-$-type epitaxial layer $22b$ located just under the gate electrode 27 serves as a channel region to define a PMOS transistor Q14.

The threshold voltage of the NMOS transistor Q13 is determined by impurity concentration of the first p-type diffusion region 23 and that of the $n^+$-type diffusion region 25. On the other hand, the threshold voltage of the PMOS transistor Q14 is determined by impurity concentration of the $n^-$-type epitaxial layer $22b$. Thus, it is possible to independently control the characteristics of the MOS transistors Q13 and Q14.

The operation of this embodiment is now described. In order to turn on the thyristor shown in FIG. 1, the NMOS transistor Q13 is turned on for a prescribed time in such a state that the anode electrode 31 is at a higher potential than the cathode electrode 28. When a positive voltage is applied to the gate electrode 27, the NMOS transistor Q13 is turned on so that electrons are injected into the base (n-type base layer 22) of the pnp transistor Q12 through the channel formed in the vicinity of the surface part of the first p-type diffusion region 23 located just under the gate electrode 27. The pnp transistor Q12 is responsively turned on, and a large quantity of holes flow toward its collector through an amplifying action of the transistor. Parts of the holes flow into the second p-type diffusion region 24 and reach the cathode electrode 28, while the remaining holes flow into the base (first p-type diffusion region 23) of the npn transistor Q11. The npn transistor Q11 is responsively turned on, so that a large quantity of electrons flow toward its collector through an amplifying action of the transistor. These electrons are supplied as a base current of the pnp transistor Q12, to further strongly turn on the pnp transistor Q12. Thus, once the transistor Q12 is turned on, a positive feedback loop is defined between the transistors Q11 and Q12, whereby a thyristor defined by the transistors Q11 and Q12 is latched. Thus, a current continuously flows between the anode electrode 31 and the cathode electrode 28 even if the NMOS transistor Q13 is turned off.

In order to turn off the thyristor shown in FIG. 1, on the other hand, the PMOS transistor Q14 is turned on for a prescribed time. When a negative voltage is applied to the gate electrode 27, the PMOS transistor Q14 is turned on so that holes to be injected into the base of the npn transistor Q11 are extracted by the cathode electrode 28 through the second p-type diffusion region 24 through the channel formed in the vicinity of the surface part of the $n^-$-type epitaxial layer $22b$ located just under the gate electrode 27. Consequently, the npn transistor Q11 is turned off and then the pnp transistor Q12 is also turned off, to release the thyristor from latching. Thus, the main current having flown between the anode electrode 31 and the cathode electrode 28 is cut off.

As hereinabove described, a positive voltage is applied to the gate electrode 27, which is common to the MOS transistors Q13 and Q14, for a prescribed time in order to turn on the thyristor shown in FIG. 1, while a negative voltage is applied to the gate electrode 27 for a prescribed time in order to turn off the thyristor.

The above operation is enciphered as follows: Assuming that $\alpha_{11}$ and $\alpha_{12}$ represent current amplification factors of the bipolar transistors Q11 and Q12, $I_{CO11}$ and $I_{CO12}$ represent collector saturation currents thereof and $I_{g11}$ and $I_{g12}$ represent ON-state currents of the MOS transistors Q13 and Q14, while h represents the rate of a part of the collector current $I_{C12}$ of the pnp transistor Q12 flowing into the second p-type diffusion region 24 and (1−h) represents the rate of another part flowing into the first p-type diffusion region 23, an anode current $I_A$ is expressed as follows:

$$I_A = \frac{(1 - \alpha_{11})I_{g11} - \alpha_{11}I_{g12} + I_{CO11} + (1 - h\alpha_{11})I_{CO12}}{1 + h\alpha_{11}\alpha_{12} - \alpha_{11} - \alpha_{12}} \quad (3)$$

In turn-on operation, the current $I_{G11}$ flows in the state of the current $I_{g12}=0$ as hereinabove described, whereby a base current $I_{B12}$ of the transistor Q12 starts to flow and the transistor Q12 starts its operation. A collector current caused by the operation of the transistor Q12 is supplied as a base current $I_{B11}$ of the transistor Q11, and the currents flowing in the transistors Q11 and Q12 are increased. In general, the current amplification factors $\alpha_{11}$ and $\alpha_{12}$ are also increased as the currents are increased, and hence the anode current $I_a$ is acceleratively raised up. The thyristor enters an ON state with:

$$\alpha_{11} - \alpha_{12} - h\alpha_{11}\alpha_{12} = 1 \quad (4)$$

In general, $h \approx \frac{1}{2}$. The solid line shown in FIG. 5 indicates the condition for the expression (4) in this case. On the other hand, the dotted line shown in FIG. 5 indicates the condition for the aforementioned expression (2) of the conventional MCT. It is hard to turn on the inventive thyristor as compared with the conventional MCT due to presence of the oblique region shown in FIG. 5, while this substantially causes no problem since the current $I_{g11}$ can be increased to a value sufficient for turning on the thyristor according to the present invention.

In turn-off operation, on the other hand, the current $I_{g12}$ flows in the state of the current $I_{g11}=0$ as hereinabove described. It is assumed here that $R_{11}$ represents a resistance component at the channels of the second p-type diffusion region 23 and the PMOS transistor Q14 with respect to the current $I_{g12}$. Due to the flow of the current $I_{g12}$, the current having flown into the base of the transistor Q11 is reduced by an amount corresponding to the current $I_{g12}$, and the value $\alpha_{11+h\alpha_{11}\alpha_{12}}$ is also reduced. A voltage drop $I_{g12}R_{11}$ at the resistance component $R_{11}$ is supplied as a base-to-emitter forward bias voltage of the transistor Q11. However, the current amplification factor $\alpha_{11}$ is abruptly reduced because this voltage is generally smaller so that electrons can not be injected into the base from the emitter of the transistor Q11. Consequently, the value $\alpha_{11+\alpha_{12}-h\alpha_{11}\alpha_{12}}$ is also acceleratively reduced, and the thyristor is turned off when $\alpha_{11+\alpha_{12}-h\alpha_{11}\alpha_{12}} < 1$.

In the embodiment shown in FIG. 1, the n+-type diffusion region 25 and the second p-type diffusion region 24 are independently in contact with the cathode electrode 28, whereby the first p-type diffusion region 23 can be sufficiently reduced in width to sufficiently reduce the resistance component $R_{11}$ as compared with the resistance component $R_1$ of the conventional MCT. Since the current $I_{g12}$ is in positive correlation with the cathode current $I_k$, a high current $I_{g12}$ flows when the MOS transistor Q14 is rendered conductive in order to turn off the thristor in a high state of the cathode current $I_k$. However, since the resistance component $R_{11}$ can be suppressed to a sufficiently small value as hereinabove described, the value of a current $I_{g12}$ with which the voltage drop $I_{g12}R_{11}$ at the resistance component $R_{11}$ exceeds the voltage capable of injecting electrons from the emitter to the base of the transistor Q11 (i.e., the thyristor cannot be turned off) is sufficiently high as compared with the value of the current $I_{g2}$ in the convention MCT. Namely, according to this embodiment, it is possible to increase the maximum main current density capable of turn-off operation as compared with the prior art.

Figure 5:
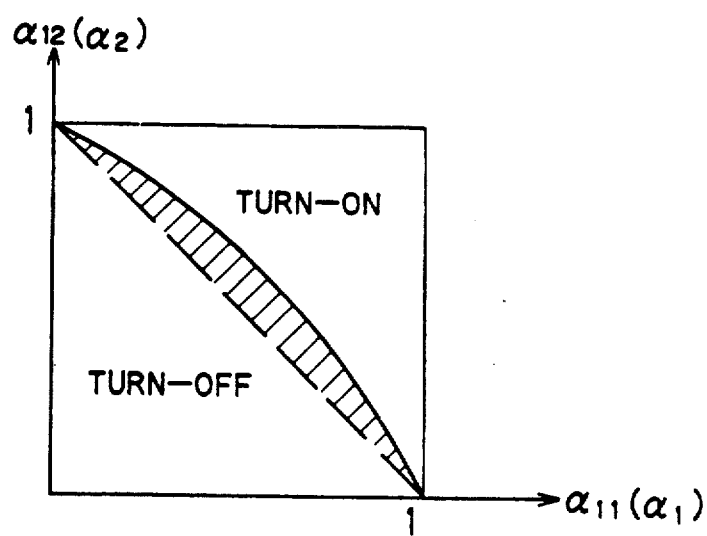
FIG. 5 is a graph showing turn-on/turn-off characteristics.

As understood from FIG. 5, the thyristor of this embodiment can be easily turned off with the same current amplification factors $\alpha_{11}$ and $\alpha_{12}$ as compared with the conventional MCT due to presence of the oblique region. Also in this point, the maximum main current density capable of turn-off operation can be increased as compared with the conventional MCT.

Figure 6A:
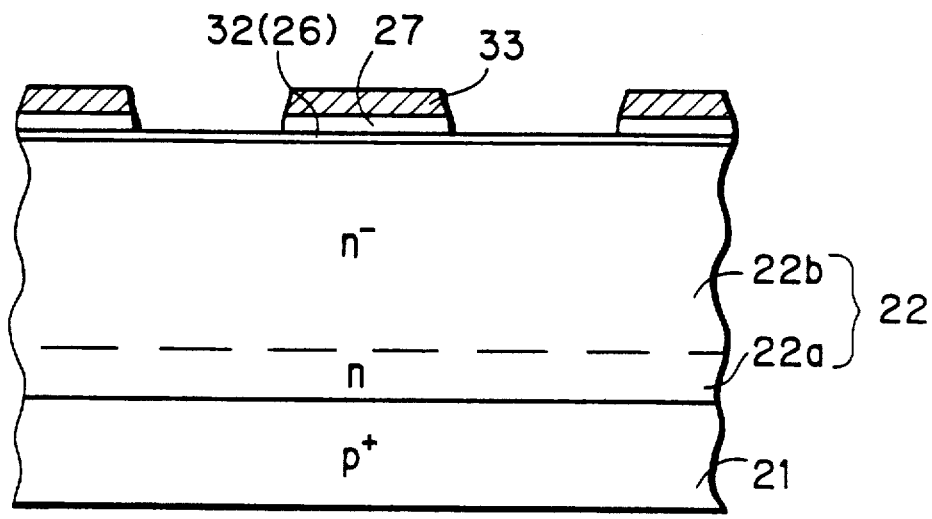
FIGS. 6A to 6D are sectional views showing an exemplary method of manufacturing the thyristor shown in FIG. 1.
Figure 6B:
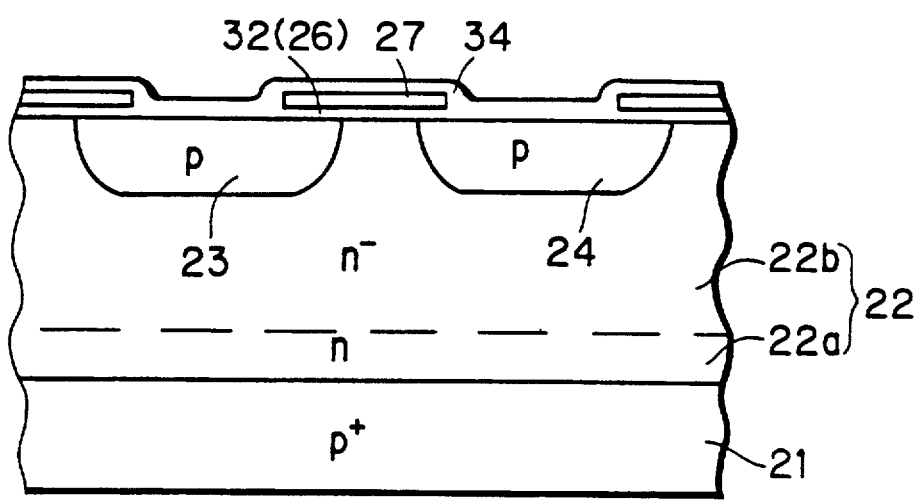
Figure 6C:
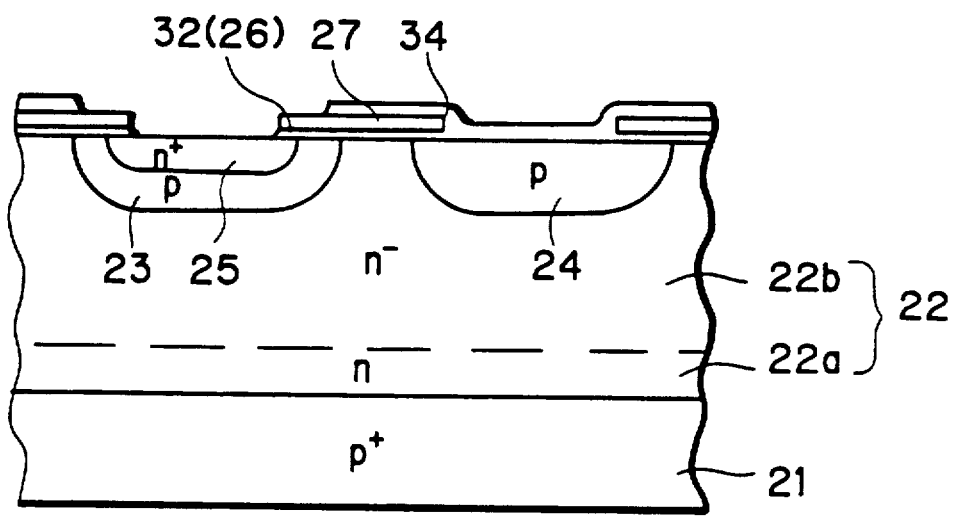
Figure 6D:
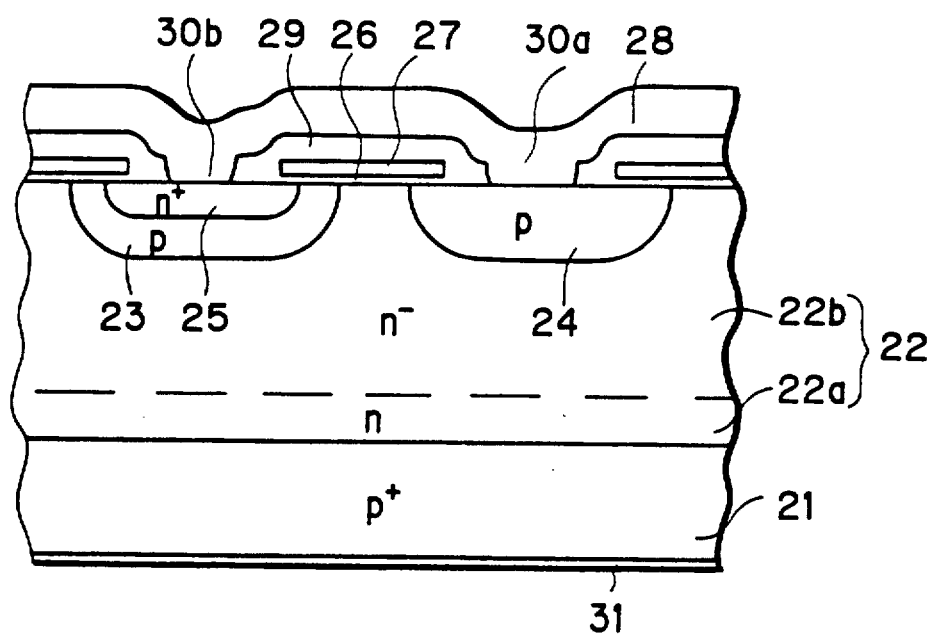

FIGS. 6A and 6D are sectional views showing an exemplary method of manufacturing the thyristor shown in FIG. 1. First, an n-type epitaxial layer 22a and an n−-type epitaxial layer 22b are successively deposited on a p+-type semiconductor substrate 21 by epitaxial growth, as shown in FIG. 6A. Then, the surface of the n−-type epitaxial layer 22b is oxidized to form an insulating film 32 over the entire surface. Thereafter a polysilicon layer and a photoresist film are successively formed over the entire surface of the insulating film 32, and the photoresist film is patterned by a photoengraving process to form a photoresist pattern 33. Then the polysilicon layer is etched through the photoresist pattern 33 serving as a mask, to form a gate electrode 27. A part of the insulating film 32 located just under the gate electrode 27 defines a gate insulating film 26.

Then the photoresist pattern 33 is removed, and a p-type impurity such as boron is injected through the gate electrode 27 serving as a mask. Thereafter the injected impurity is diffused by annealing, thereby forming first and second p-type diffusion regions 23 and 24, in self-alignment manner, as shown in FIG. 6B. An oxide film 34 is formed over the entire surface by thermal oxidation in the annealing step.

Then, the oxide film 34 is patterned by a photoengraving process, as shown in FIG. 6C. An n-type impurity (not shown) such as phosphorus is deposited and the deposited n-type impurity is selectively diffused by annealing, thereby forming an n+-type diffusion region 25, in self-alignment manner.

Then, the entire surface is covered with an interlayer isolation film 29, and contact holes 30a and 30b are defined in the interlayer isolation film 29 through a photoengraving process, as shown in FIG. 6D. Thereafter an Al layer is deposited by Al-Si sputtering and selectively etched to form a cathode electrode 28. An anode electrode 31 of Al is formed on the back surface of the p+-type semiconductor substrate 21 by vapor deposition. Thus, the structure shown in FIG. 1 is obtained.

Figure 7:
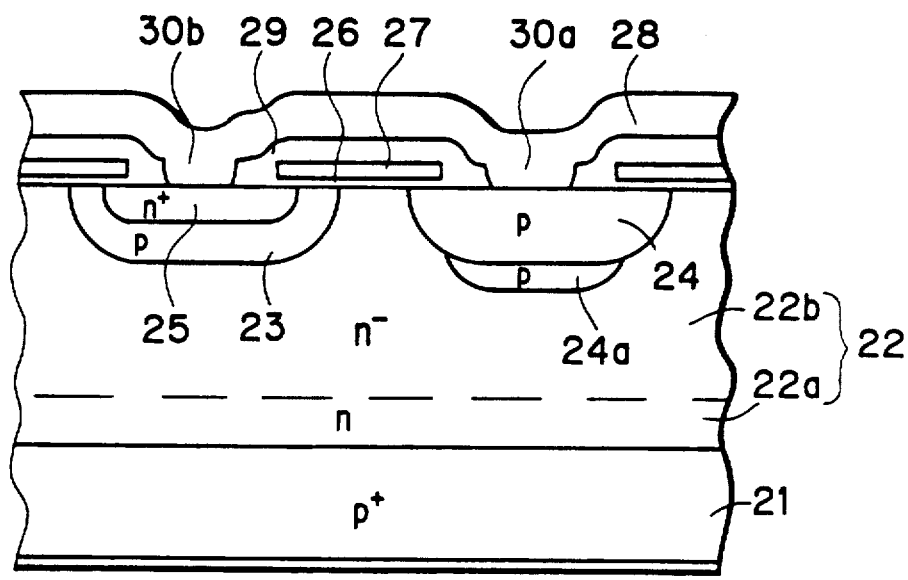
FIGS. 7 to 9 are sectional views showing other embodiments of the thyristor according to the present invention.

FIG. 7 is a sectional view showing another embodiment of the thyristor according to the present invention. According to this embodiment, a deep p-type diffusion region 24a is additionally formed under a second p-type diffusion region 24, thereby substantially increasing the depth of the second p-type diffusion region 24. The structure shown in FIG. 7 is obtained by carrying out two diffusion steps, a deep second p-type diffusion region 24 may alternatively be formed by a single diffusion step. The depth of the second p-type diffusion region 24 is thus increased for the following reason: When an avalanche is caused by junction of the n-type base layer 22 and the second p-type diffusion region 24 in the structure shown in FIG. 1, junction of the n-type base layer 22 and the first p-type diffusion region 23 simultaneously causes an avalanche since the first and second p-type diffusion regions 23 and 24 are identical in depth to each other. Therefore, even if the gate electrode 27 is negatively biased to turn on the PMOS transistor Q14, an avalanche current at the first p-type diffusion region 23 may be partially injected into the n+-type diffusion region 25, to erroneously turn on the thyristor. Thus, the p-type diffusion region 24a is provided as shown in FIG. 7 to substantially increase the depth of the second p-type diffusion region 24, so that an avalanche is necessarily caused only in the second p-type diffusion region 24, to prevent the thyristor from erroneous turn-on operation.

An effect similar to the above can also be attained by increasing impurity concentration in place of increasing the depth of the second p-type diffusion region 24.

In the structure shown in FIG. 7, further, holes injected from the p+-type semiconductor substrate 21 are absorbed by the second p-type diffusion region 24 in a larger quantity than those absorbed in the first p-type diffusion region 23, whereby the value of the parameter h in the above expression (3) is increased and it is consequently possible to further increase the maximum main current density capable of turn-off operation.

Figure 8:
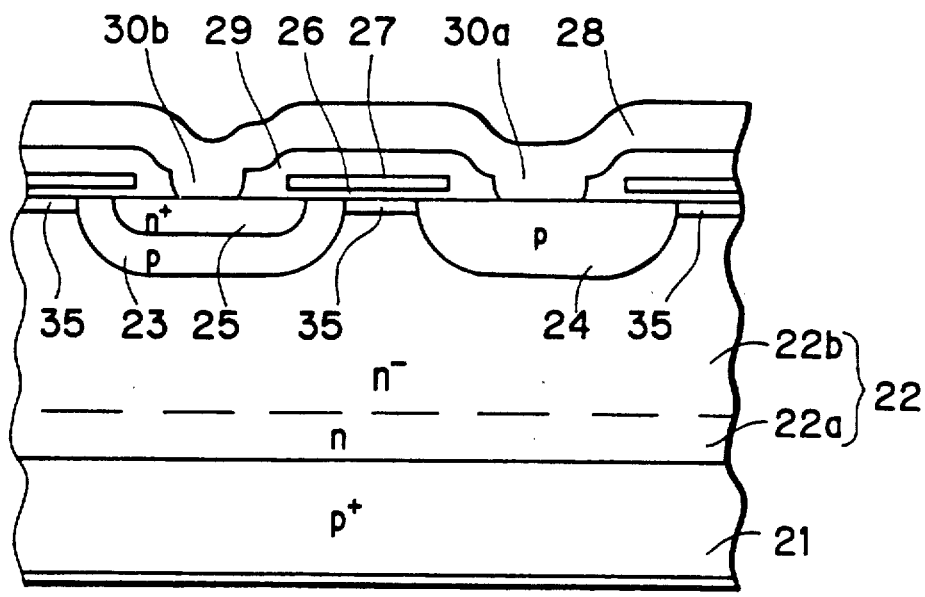

FIG. 8 is a sectional view showing still another embodiment of the thyristor according to the present invention. According to this embodiment, a p⁻-type layer 35 is formed on a surface part of an n⁻-type epitaxial layer 22b which is held between first and second p-type diffusion regions 23 and 24. Thus, channel resistance of a PMOS transistor Q14 is so reduced that a resistance component $R_{11}$ with respect to a current $I_{g12}$ flowing in the PMOS transistor Q14 at a turn-off time can be reduced, whereby it is possible to improve the maximum main current density capable of turn-off operation. According to this embodiment, further, it is possible to arbitrarily set the threshold voltage of the PMOS transistor Q14 by impurity concentration in the p⁻-type layer Q14, regardless of impurity concentration in the n⁻-type epitaxial layer 22b.

Figure 9:
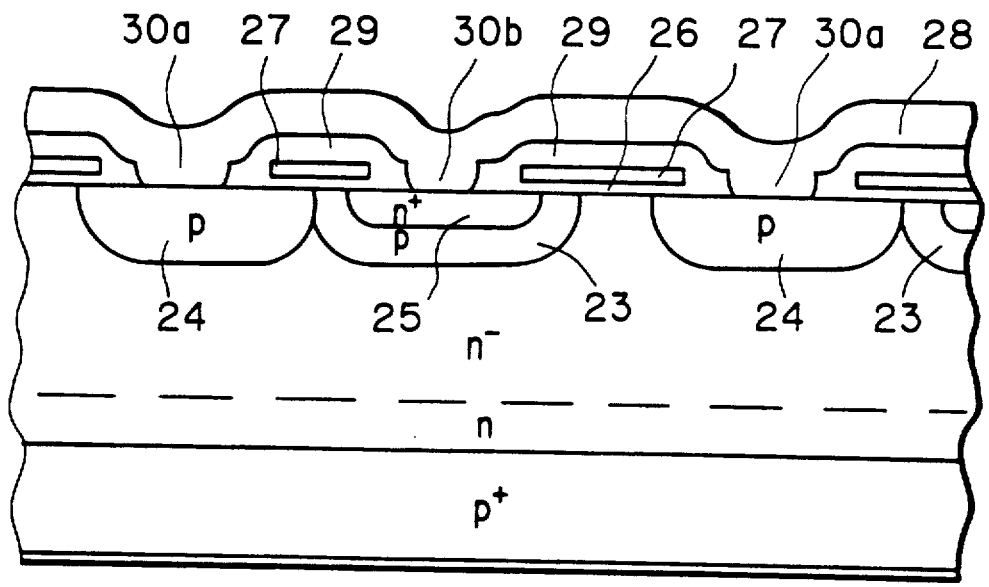
Figure 11:
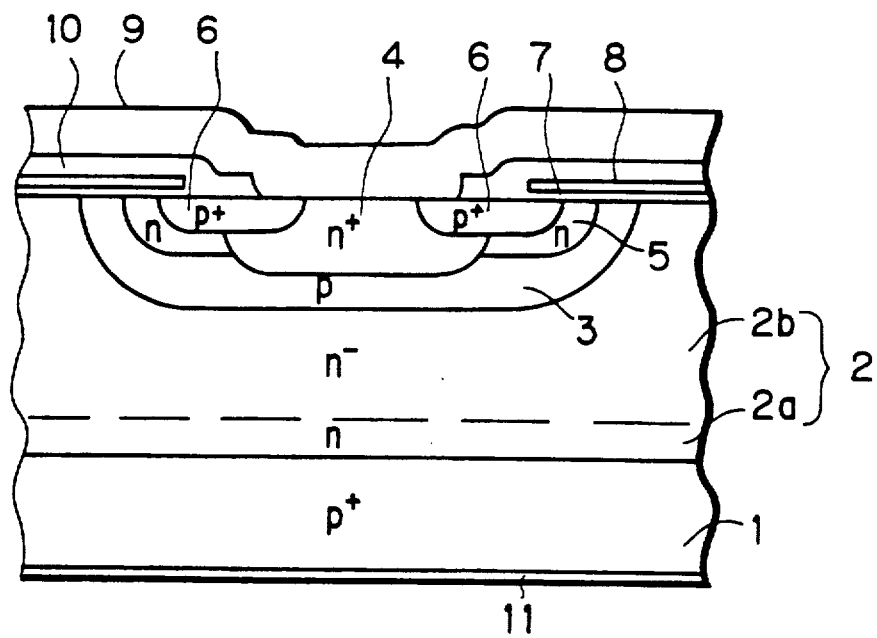
FIG. 11 is a sectional view showing a conventional MCT.
Figure 10:
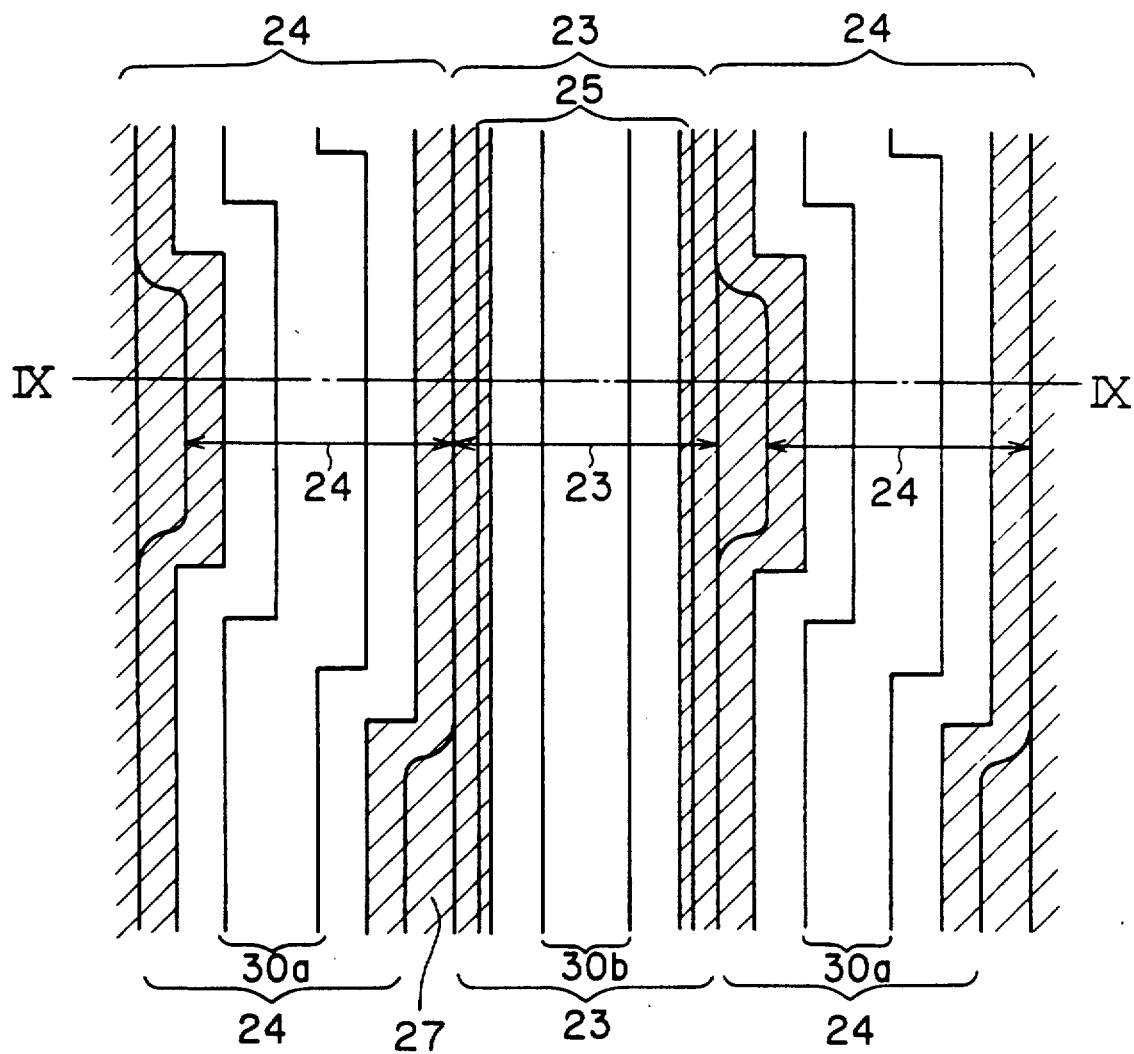
FIG. 10 is a plan view showing a plane pattern for the structure shown in FIG. 9.
Figure 12:
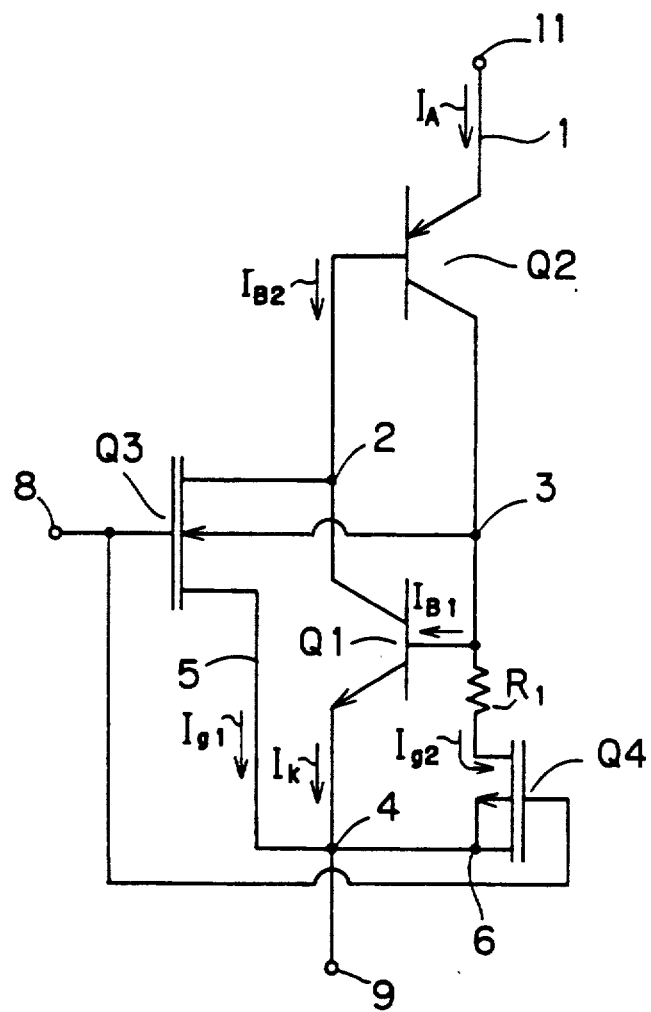
FIG. 12 is a circuit diagram showing an equivalent circuit of the MCT shown in FIG. 11.

FIG. 9 is a sectional view showing a further embodiment of the inventive thyristor. According to this embodiment, first and second p-type diffusion regions 23 and 24 are brought into contact with each other, in place of providing the p⁻-type layer 35 shown in FIG. 8. The first and second p-type diffusion regions 23 and 24 may be partially in contact with each other, as shown in a plan view of FIG. 10. FIG. 9 shows a section taken along the line IX—IX in FIG. 10. The first and second p-type diffusion regions 23 and 24 are so partially brought into contact with each other that channel resistance of a PMOS transistor Q14 is substantially reduced and a resistance component $R_{11}$ with respect to a current $I_{g12}$ flowing in the PMOS transistor Q14 at a turn-off time can be reduced similarly to the embodiment shown in FIG. 8, whereby it is possible to improve the maximum main current density capable of turn-off operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thyristor, comprising:
   a first conductivity type first semiconductor layer having first and second major surfaces;
   a second conductivity type second semiconductor layer formed on said first major surface of said first semiconductor layer;
   first conductivity type first and second semiconductor regions selectively formed in a surface of said second semiconductor layer in a spaced-apart manner;
   a second conductivity type third semiconductor region selectively formed in a surface of said first semiconductor region so as to be formed completely within said first semiconductor region;
   a first insulating film formed on a surface part of said first semiconductor region so as to be disposed between surfaces of said second semiconductor layer and said third semiconductor region;
   a second insulating film formed on a surface part of said second semiconductor layer so as to be disposed between surfaces of said first and second semiconductor regions;
   a first control electrode formed on said first insulating film;
   a second control electrode formed on said second insulating film;
   a first main electrode formed in contact with said second and third semiconductor regions; and
   a second main electrode formed on said second major surface of said first semiconductor layer,
   wherein said first semiconductor region does not contact said first main electrode, and said second semiconductor region does not include third semiconductor regions formed therein.

2. A thyristor in accordance with claim 1, wherein
   said first and second insulating films are combined into a common insulating film, and
   said first and second control electrodes are combined into a common control electrode.

3. A thyristor in accordance with claim 1, wherein said second seimconductor region is larger in depth than said first semiconductor region.

4. A thyristor in accordance with claim 1, further comprising
   a first conductivity type fourth semiconductor region selectively formed in said second semiconductor layer at a bottom of said second semiconductor region.

5. A thyristor in accordance with claim 1, wherein said second semiconductor region is larger in impurity concentration than said first semiconductor region.

6. A thyristor in accordance with claim 1, further comprising
   a first conductivity type fourth semiconductor region selectively formed in said second semiconductor layer just under said second insulating film.

7. A thyristor in accordance with claim 6, wherein said fourth semiconductor region is smaller in impurity concentration than said first and second semiconductor regions.

8. A thyristor in accordance with claim 1, further comprising
- a first conductivity type fourth semiconductor region selectively formed in the surface of said second semiconductor layer adjacent to said first semiconductor region,
- a third insulating film formed on a surface part of said first semiconductor region so as to be disposed between surfaces of said third and fourth semiconductor regions, and
- a third control electrode formed on said third insulating film, wherein
- said first main electrode being also in contact with said fourth semiconductor region.

* * * * *